United States Patent
Song et al.

(10) Patent No.: US 9,767,248 B2
(45) Date of Patent: Sep. 19, 2017

(54) SEMICONDUCTOR HAVING CROSS COUPLED STRUCTURE AND LAYOUT VERIFICATION METHOD THEREOF

(71) Applicant: Samsung Electronics Co., Ltd., Suwon-si, Gyeonggi-do (KR)

(72) Inventors: Taejoong Song, Seongnam-si (KR); Jung-Ho Do, Yongin-si (KR); Changho Han, Hwaseong-si (KR)

(73) Assignee: SAMSUNG ELECTRONICS, CO., LTD., Gyeonggi-Do (KR)

(*) Notice: Subject to any disclaimer, the term of this patent is extended or adjusted under 35 U.S.C. 154(b) by 5 days.

(21) Appl. No.: 14/844,420

(22) Filed: Sep. 3, 2015

(65) Prior Publication Data

US 2016/0085904 A1 Mar. 24, 2016

Related U.S. Application Data

(60) Provisional application No. 62/052,076, filed on Sep. 18, 2014.

(30) Foreign Application Priority Data

Mar. 4, 2015 (KR) .................. 10-2015-0030512

(51) Int. Cl.
G06F 9/455 (2006.01)
G06F 17/50 (2006.01)
G01R 31/28 (2006.01)

(52) U.S. Cl.
CPC ..... *G06F 17/5081* (2013.01); *G01R 31/2882* (2013.01); *G06F 2217/14* (2013.01)

(58) Field of Classification Search
USPC .............................. 716/106, 104, 108, 113
See application file for complete search history.

(56) References Cited

U.S. PATENT DOCUMENTS 5,661,419 A * 8/1997 Bhagwan ............. H03L 7/0891
327/157
6,423,558 B1 7/2002 Maeda et al.
(Continued)

FOREIGN PATENT DOCUMENTS

JP 11211793 8/1999
JP 3233347 B2 11/2001
(Continued)

OTHER PUBLICATIONS

U.S. Office Action dated Oct. 21, 2016 issued in co-pending U.S. Appl. No. 14/854,358.
(Continued)

*Primary Examiner* — Brian Ngo
(74) *Attorney, Agent, or Firm* — Harness, Dickey & Pierce, PLC

(57) ABSTRACT

A semiconductor device and a layout verification method of a semiconductor device are provided. The layout verification method includes forming a plurality of standard cells each having a first type of a cross coupled structure (XC) and a second type of the XC on a substrate of the semiconductor device, forming a plurality of first inverters in which the first type of the XC is activated in the a plurality of the standard cells and a plurality of second inverters in which the second type of the XC is activated in the a plurality of the standard cells and estimating an electrical characteristic of the first type of the XC or the second type of the XC by measuring a magnitude of a signal delay of the plurality of the first inverters or the plurality of the second inverters.

19 Claims, 14 Drawing Sheets

(56) References Cited

U.S. PATENT DOCUMENTS

| | | | |
|---|---|---|---|
| 6,469,493 B1* | 10/2002 | Muething, Jr. | G01R 31/2882 324/762.01 |
| 6,532,579 B2 | 3/2003 | Sato et al. | |
| 6,662,350 B2 | 12/2003 | Fried et al. | |
| 7,102,413 B2 | 9/2006 | Kuroda | |
| 7,547,597 B2 | 6/2009 | Kau et al. | |
| 7,685,540 B1 | 3/2010 | Madden et al. | |
| 7,917,872 B2 | 3/2011 | Tanefusa et al. | |
| 7,956,421 B2 | 6/2011 | Becker | |
| 7,960,759 B2 | 6/2011 | Frederick et al. | |
| 8,102,018 B2* | 1/2012 | Bertin | B82Y 10/00 257/209 |
| 8,138,783 B2 | 3/2012 | Rius Vazquez et al. | |
| 8,183,114 B2 | 5/2012 | Tsuboi et al. | |
| 8,224,604 B1 | 7/2012 | Amrutur et al. | |
| 8,239,803 B2 | 8/2012 | Kobayashi | |
| 8,258,578 B2 | 9/2012 | Carlson | |
| 8,264,044 B2 | 9/2012 | Becker | |
| 8,312,394 B2 | 11/2012 | Ban et al. | |
| 8,352,899 B1 | 1/2013 | Yap et al. | |
| 8,362,480 B1 | 1/2013 | Hess et al. | |
| 8,365,108 B2 | 1/2013 | Baum et al. | |
| 8,397,193 B2 | 3/2013 | Ting et al. | |
| 8,543,089 B2 | 9/2013 | Chun et al. | |
| 8,569,841 B2 | 10/2013 | Becker et al. | |
| 8,581,348 B2 | 11/2013 | Rashed et al. | |
| 8,631,382 B2 | 1/2014 | Wang et al. | |
| 8,653,630 B2 | 2/2014 | Liaw et al. | |
| 8,726,215 B2 | 5/2014 | Lee et al. | |
| 8,726,217 B2 | 5/2014 | Gullette | |
| 8,726,220 B2 | 5/2014 | Lin et al. | |
| 8,732,641 B1 | 5/2014 | Yuh et al. | |
| 8,741,763 B2 | 6/2014 | Ma et al. | |
| 8,775,977 B2 | 7/2014 | Hsu et al. | |
| 8,775,999 B2 | 7/2014 | Chueh et al. | |
| 8,782,575 B1 | 7/2014 | Hsu et al. | |
| 8,782,586 B2 | 7/2014 | Sezginer et al. | |
| 8,799,834 B1 | 8/2014 | Chen et al. | |
| 8,802,574 B2 | 8/2014 | Yuan et al. | |
| 8,853,794 B2 | 10/2014 | Becker et al. | |
| 8,878,303 B2 | 11/2014 | Hatamian et al. | |
| 8,902,094 B1* | 12/2014 | Zhang | H03L 7/0814 341/122 |
| 8,904,337 B2 | 12/2014 | Yang et al. | |
| 8,924,908 B2 | 12/2014 | Kawa et al. | |
| 8,946,824 B2 | 2/2015 | Ikegami et al. | |
| 8,947,912 B2 | 2/2015 | Calhoun et al. | |
| 8,987,128 B2 | 3/2015 | Rashed et al. | |
| 8,997,026 B1 | 3/2015 | Sweis | |
| 9,009,641 B2 | 4/2015 | Becker et al. | |
| 9,021,405 B2 | 4/2015 | Hiramoto et al. | |
| 9,035,393 B2 | 5/2015 | Ma et al. | |
| 9,355,910 B2 | 5/2016 | Rashed et al. | |
| 2001/0044918 A1 | 11/2001 | Sato et al. | |
| 2003/0016551 A1* | 1/2003 | Takemura | G11C 5/025 365/63 |
| 2003/0145299 A1 | 7/2003 | Fried et al. | |
| 2003/0200493 A1* | 10/2003 | Campbell | G01R 31/31854 714/726 |
| 2004/0012429 A1* | 1/2004 | Lindberg | H03K 5/135 327/277 |
| 2004/0109368 A1 | 6/2004 | Kuroda | |
| 2004/0133868 A1 | 7/2004 | Ichimiya | |
| 2005/0044522 A1 | 2/2005 | Maeda | |
| 2005/0155001 A1 | 7/2005 | Kinoshita et al. | |
| 2006/0136848 A1 | 6/2006 | Ichiryu et al. | |
| 2006/0225016 A1 | 10/2006 | Fukasawa | |
| 2006/0267224 A1 | 11/2006 | Kau et al. | |
| 2007/0075718 A1 | 4/2007 | Hess et al. | |
| 2008/0216041 A1 | 9/2008 | Wangxiao et al. | |
| 2009/0037855 A1 | 2/2009 | Tanefusa et al. | |
| 2009/0091346 A1* | 4/2009 | Chuang | G11C 29/50 324/762.09 |
| 2009/0144677 A1 | 6/2009 | Gonzalez et al. | |
| 2009/0224317 A1 | 9/2009 | Becker | |
| 2009/0315583 A1 | 12/2009 | Rius Vazquez et al. | |
| 2010/0090260 A1 | 4/2010 | Frederick et al. | |
| 2010/0093145 A1 | 4/2010 | Tsuboi et al. | |
| 2010/0187615 A1 | 7/2010 | Becker | |
| 2010/0201376 A1 | 8/2010 | Ouyang et al. | |
| 2010/0252892 A1 | 10/2010 | Becker | |
| 2010/0269073 A1 | 10/2010 | Ting et al. | |
| 2011/0014786 A1 | 1/2011 | Sezginer et al. | |
| 2011/0049635 A1 | 3/2011 | Carlson | |
| 2011/0131440 A1* | 6/2011 | Noda | H03K 5/133 713/401 |
| 2011/0289467 A1 | 11/2011 | Kobayashi | |
| 2012/0137261 A1 | 5/2012 | Ban et al. | |
| 2012/0180006 A1 | 7/2012 | Baum et al. | |
| 2012/0192135 A1 | 7/2012 | Gullette | |
| 2012/0210279 A1 | 8/2012 | Hsu et al. | |
| 2012/0254817 A1 | 10/2012 | Sherlekar | |
| 2012/0278777 A1 | 11/2012 | Lin et al. | |
| 2012/0299065 A1 | 11/2012 | Shimizu | |
| 2012/0329266 A1 | 12/2012 | Hiramoto et al. | |
| 2013/0016982 A1* | 1/2013 | Henzler | H04B 10/50 398/161 |
| 2013/0021075 A1* | 1/2013 | Felix | G06F 1/10 327/164 |
| 2013/0026572 A1 | 1/2013 | Kawa et al. | |
| 2013/0036397 A1 | 2/2013 | Lee et al. | |
| 2013/0042216 A1 | 2/2013 | Loh et al. | |
| 2013/0086542 A1 | 4/2013 | Teoh et al. | |
| 2013/0126978 A1 | 5/2013 | Becker et al. | |
| 2013/0146982 A1 | 6/2013 | Rashed et al. | |
| 2013/0200395 A1 | 8/2013 | Liaw et al. | |
| 2013/0239077 A1 | 9/2013 | Wang et al. | |
| 2013/0242645 A1 | 9/2013 | Calhoun et al. | |
| 2013/0244427 A1 | 9/2013 | Yuan et al. | |
| 2013/0292772 A1 | 11/2013 | Ma et al. | |
| 2013/0320451 A1 | 12/2013 | Liu et al. | |
| 2014/0027918 A1 | 1/2014 | Rashed et al. | |
| 2014/0054722 A1 | 2/2014 | Kawa et al. | |
| 2014/0119099 A1* | 5/2014 | Clark | G11C 5/146 365/149 |
| 2014/0130003 A1 | 5/2014 | Cheuh et al. | |
| 2014/0131816 A1 | 5/2014 | Wang et al. | |
| 2014/0137062 A1 | 5/2014 | Yuh et al. | |
| 2014/0183646 A1 | 7/2014 | Hatamian et al. | |
| 2014/0185365 A1 | 7/2014 | Liaw | |
| 2014/0189635 A1 | 7/2014 | Yang et al. | |
| 2014/0203378 A1 | 7/2014 | Ou et al. | |
| 2014/0208282 A1 | 7/2014 | Hsu et al. | |
| 2014/0210014 A1 | 7/2014 | Ma et al. | |
| 2014/0210015 A1 | 7/2014 | Becker et al. | |
| 2014/0255164 A1 | 9/2014 | Hayes-Pankhurst et al. | |
| 2014/0264894 A1 | 9/2014 | Tien et al. | |
| 2015/0143309 A1 | 5/2015 | De Dood et al. | |
| 2015/0213184 A1 | 7/2015 | Yuan et al. | |
| 2015/0287604 A1 | 10/2015 | Stephens et al. | |
| 2015/0370949 A1* | 12/2015 | Moroz | G06F 17/5072 716/119 |
| 2015/0370950 A1* | 12/2015 | Kawa | G06F 17/5072 716/119 |
| 2016/0025805 A1 | 1/2016 | Uppal et al. | |

FOREIGN PATENT DOCUMENTS

| | | |
|---|---|---|
| JP | 200350266 A | 2/2003 |
| JP | 2003-149983 A | 5/2003 |
| JP | 2005-149313 A | 6/2005 |
| JP | 2005252143 A | 9/2005 |
| JP | 2007-264993 A | 10/2007 |
| JP | 2010266254 A | 11/2010 |
| JP | 2011-233869 A | 11/2011 |
| JP | 5153089 B2 | 2/2013 |
| JP | 2013-120852 A | 6/2013 |
| JP | 2014-131063 A | 7/2014 |
| KR | 100480585 B1 | 6/2005 |
| KR | 2007109434 A | 11/2007 |
| KR | 20080045517 A | 5/2008 |
| KR | 10-2012-0125275 A | 11/2012 |

(56) References Cited

FOREIGN PATENT DOCUMENTS

| KR | 10-2013-0067213 A | 6/2013 |
|---|---|---|
| KR | 10-2014-0012012 A | 1/2014 |
| KR | 20140043399 A | 4/2014 |

OTHER PUBLICATIONS

U.S. Appl. No. 14/854,358, filed Sep. 15, 2015.
U.S. Appl. No. 14/844,398, filed Sep. 3, 2015.
U.S. Appl. No. 14/843,491, filed Sep. 3, 2015.
U.S. Appl. No. 14/848,758, filed Sep. 9, 2015.
U.S. Office Action dated Sep. 12, 2016 issued in co-pending U.S. Appl. No. 14/848,758.
Hess, et al. "Direct Probing Characterization Vehicle Test Chip for Wafer Level Exploration of Transistor Pattern on Product Chips," IEEE Confrence on Microelectronic Test Structures, pp. 219-223 (2014).
Notice of Allowance dated Mar. 2, 2017 issued in related U.S. Appl. No. 14/854,358.
U.S. Office Action dated Feb. 2, 2017 issued in copending U.S. Appl. No. 14/844,398.
"Binary Decoder", Electronics Tutorials, pp. 1-5 (2014).
"Standard cell", Wikipedia, The Free Encyclopedia, pp. 1-5 (2013).
Hess, et al. "Direct Probing Characterization Vehicle Test Chip for Wafer Level Exploration of Transistor Pattern on Product Chips," IEEE Confrence on Microelectronic Test Structures, pp. 219-223 (2014). 4—.
U.S. Office Action dated Jul. 11, 2017 issued in co-pending U.S. Appl. No. 14/844,398.

\* cited by examiner

SEMICONDUCTOR HAVING CROSS COUPLED STRUCTURE AND LAYOUT VERIFICATION METHOD THEREOF

CROSS-REFERENCE TO RELATED APPLICATIONS

This U.S. non-provisional patent application claims the benefit of U.S. Provisional Patent Application No. 62/052,076, filed on Sep. 18, 2014, and claims priority to Korean Patent Application No. 10-2015-0030512, filed on Mar. 4, 2015 in the Korean Intellectual Property Office (KIPO), the entire contents of which are hereby incorporated by reference in entirety.

BACKGROUND

The inventive concepts described herein relate to a semiconductor device, and more particularly, relate to a semiconductor device which has a cross coupled structure and layout verification method thereof.

Usage of mobile devices such as a smart-phone, a tablet personal computer (PC), a digital camera, a MP3 player, and a personal digital assistant (PDA) is increasing. As throughput of various data and driving of multimedia increases in this mobile device, a high-speed processor is largely applied to the mobile device. Various application programs are driven in the mobile device. To drive various application programs, semiconductor devices such as a working memory (e.g., DRAM), a nonvolatile memory, and an application processor (AP) are used in the mobile device.

When a new process for generating a semiconductor device is used, a method of monitoring characteristics of a plurality of transistors in the semiconductor device is used to increase a yield. Verification in a layout design operation may be needed and/or desired to increase yield and reduce a cost by blocking a problem that occurs in producing a semiconductor device in advance. A cross coupled structure (hereinafter referred to as "XC") that is used in a complex structure is desired to improve the degree of integration of the semiconductor device.

So much time and/or cost are consumed to apply and verify the XC in various circuit structures. When a problem or a fault exists in the XC in a real production operation, a cost is paid to solve this problem. Therefore, a method of verifying the XC of a real cell environment in a layout design operation may be desired.

SUMMARY

Example embodiments of the inventive concepts are directed to providing a semiconductor device under testing and a method that are capable of measuring and verifying a characteristic of a cross coupled structure in the semiconductor device in a layout design operation.

Example embodiments of the inventive concepts are not limited to the above disclosure; other objectives may become apparent to those of ordinary skill in the art based on the following descriptions.

In accordance with one example embodiment of the inventive concepts, a layout verification method of a semiconductor device having a cross coupled structure (hereinafter referred to as "XC) is provided. The layout verification method includes forming a plurality of standard cells each having a first type of XC and a second type of XC on a substrate of the semiconductor device, forming a plurality of first inverters in which the first type of the XC is activated in the a plurality of the standard cells and a plurality of second inverters in which the second type of the XC is activated in the a plurality of the standard cells, and estimating an electrical characteristic of the first type of the XC or the second type of the XC by measuring a magnitude of a signal delay of the plurality of the first inverters or the plurality of the second inverters.

In accordance with another example embodiment of the inventive concepts, a semiconductor device includes a first circuit configured to electrically connect elements or conductive lines using a first connection structure, a second circuit configured to electrically connect elements or conductive lines using a second connection structure, and a plurality of pads configured to verify an electrical characteristic of the first connection structure or the second connection structure by measuring an input and output characteristic of the first circuit or the second circuit.

In accordance with another example embodiment of the inventive concepts, a layout verification method includes providing a power voltage to one terminal of a first transistor, electrically connecting the XC between the other terminal of the first transistor and one terminal of a second transistor, and providing a semiconductor device including a third transistor configured to detect a direct current corresponding to a magnitude of a voltage where the power voltage is distributed through the XC to the other terminal of the first transistor, adjusting a magnitude of a voltage distributed to the XC by applying a control voltage to a gate of the second transistor and detecting a channel current of the third transistor corresponding to the adjusted distributed voltage.

In accordance with a semiconductor device according to at least one example embodiment of the inventive concepts and a test method thereof, a XC is implemented on a chip in a layout design operation and the test method is capable of measuring an electrical characteristic of the XC. Accordingly, a semiconductor device under test and a manufacturing method thereof may perform, measure, and verify a magnitude of the electrical characteristic or delay of the XC in a development operation of the semiconductor device.

In at least one example embodiment, a method of verifying a layout structure including a cross coupled structure includes performing at least one of a schematic design operation and a layout design operation on a semiconductor device, forming the semiconductor device, the semiconductor device including a ring oscillator, the ring oscillator a first type of cross coupled structures and a second type of cross coupled structures, and testing the semiconductor device.

In at least one example embodiment, the testing the semiconductor device includes inputting signals to the ring oscillator through pads and/or detecting output signals of the ring oscillator. The method may also include calculating delay differences of the cross coupled structures based on the output signals.

BRIEF DESCRIPTION OF THE FIGURES

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION

Figure 1:
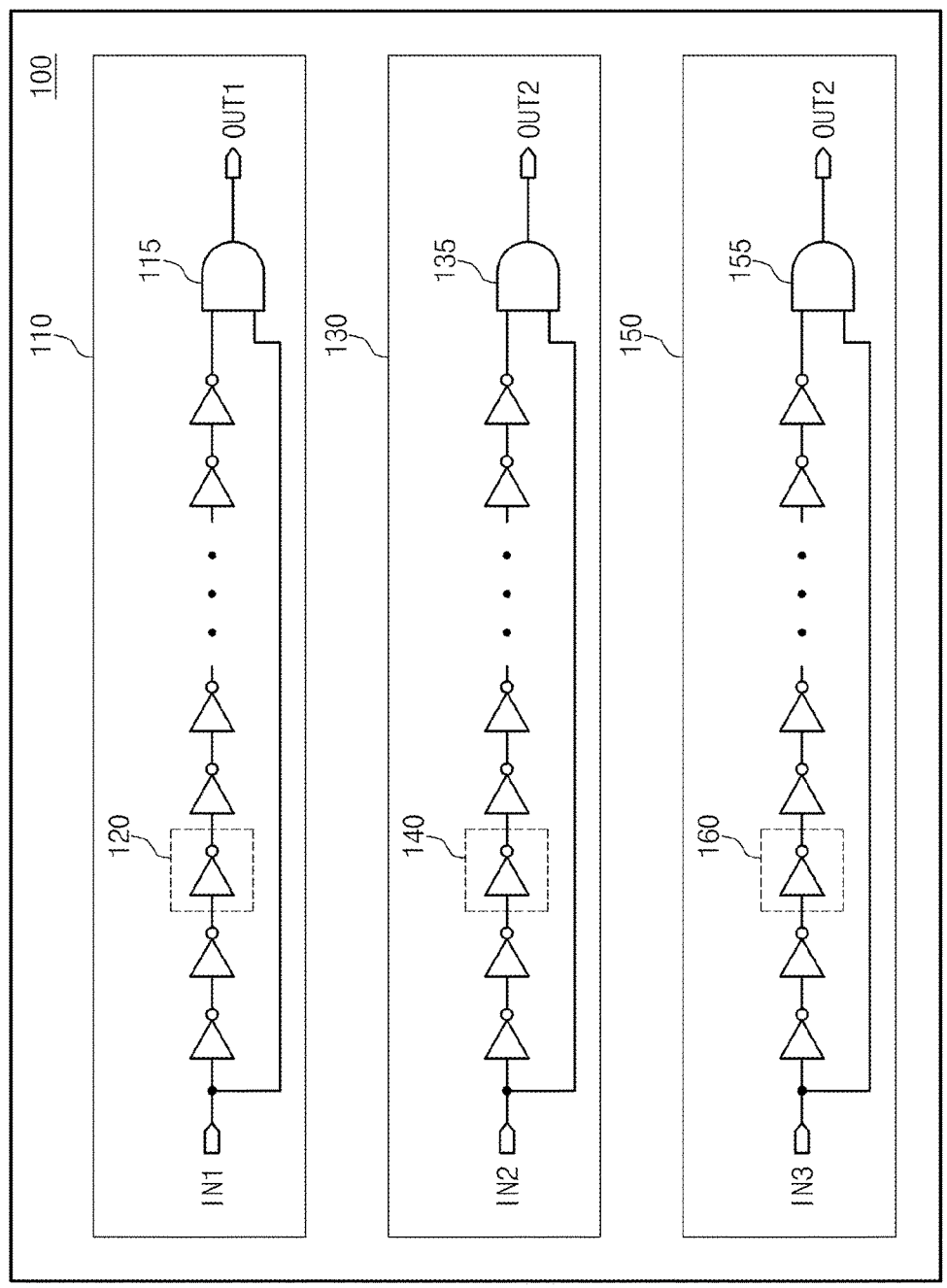
FIG. 1 is a block diagram illustrating a semiconductor device under test according to at least one example embodiment of the inventive concepts.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a semiconductor device under test according to at least one example embodiment of the inventive concepts. Referring to FIG. 1, a semiconductor device under test 100 may include ring oscillators 110, 130, and 150. Each of the ring oscillators 110, 130, and 150 may have a structure of a pulse generator including a delay chain.

In at least one example embodiment, each of the ring oscillators 110, 130, and 150 may include inverters formed by changing an interconnection of a multiplexer cell. Moreover, the inverters may constitute a delay chain, and input signals IN1, IN2, and IN3, which pass through the delay chain, and an input signal, which does not pass through the delay chain, may be inputted to AND gates 115, 135, and 155, respectively. Each of the AND gates 115, 135, and 155 may output a pulse signal through a logical AND operation on a delayed input signal and an input signal which is not delayed. A pulse width of the pulse signal outputted from each of the AND gates 115, 135, and 155 may include delay information of the inverters constituting the delay chain.

In at least one example embodiment, the inverters 120, 140, and 160 may have different kinds of XCs, thereby allowing electrical characteristics of the inverters 120, 140, and 160 to differ from each other. In response to rising edges of the input signals IN1, IN2, and IN3, the ring oscillators 110, 130, and 150 may provide output signals OUT1, OUT2, and OUT3 of a delayed pulse shape. Here, a signal delay due to one inverter may be calculated by dividing a pulse width of each of the output signals OUT1, OUT2, and OUT3 by the number of inverters constituting a delay chain.

In at least one example embodiment, the XC formed in each of the inverters 120, 140, and 160 may be variously selected. In at least one example embodiment, the XC of the inverter 120 within the ring oscillator 110 may be composed of a contact CA which connects a conductive line and an active region. The XCs of the inverters constituting one delay chain may be identically formed. In at least one example embodiment, the inverter 140 within the ring oscillator 130 may include a metal layer as the XC. Moreover, the inverter 160 within the ring oscillator 150 may include a contact, which connects poly silicon layers, as the XC.

When the semiconductor device 100 according to at least one example embodiment of the inventive concepts is used, electrical characteristics of cells in which XCs are included may be verified in a layout operation of a semiconductor device. The inverters constituting a delay chain may be formed using a multiplexer having the XC. That is, in a multiplexer having a plurality of XCs, an inverter may be formed by routing any XC. When a ring oscillator is implemented by connecting inverters as a delay chain, a magnitude of a delay due to each XC may be detected.

Figure 2:
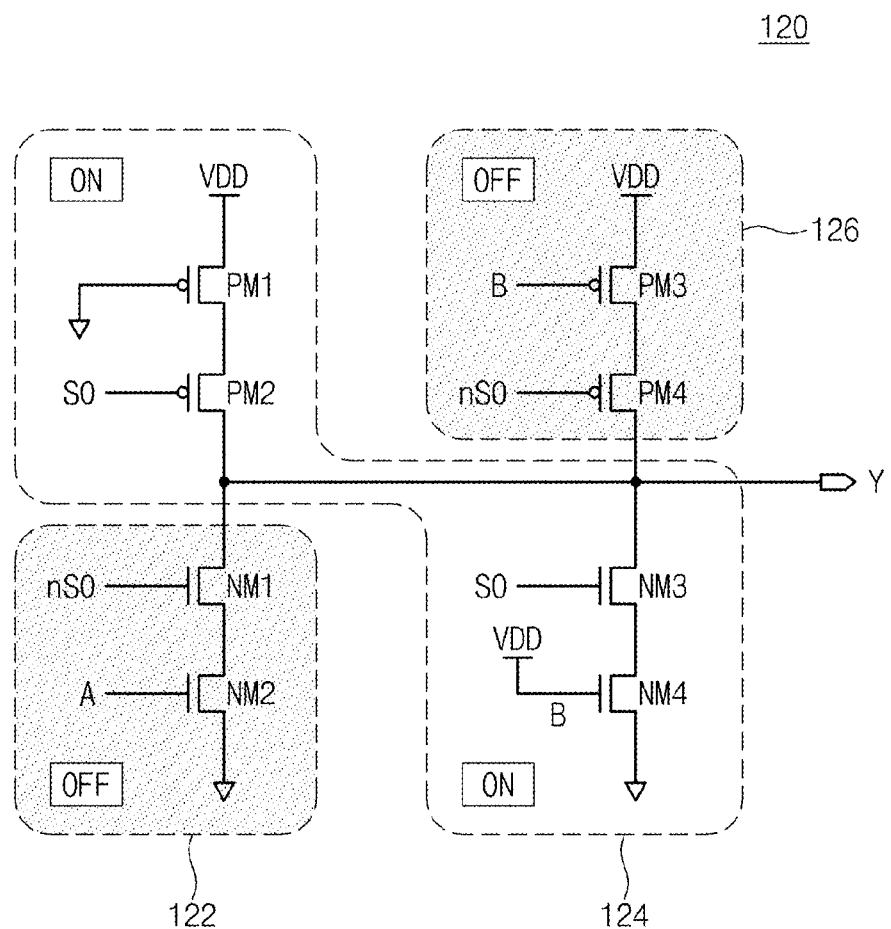
FIG. 2 is a circuit diagram illustrating a structure of the inverter in FIG. 1.

FIG. 2 is a circuit diagram illustrating a structure of the inverter 120 in FIG. 1. Referring to FIG. 2, an inverter 120 may activate one of a plurality of XCs included in a multiplexer.

To operate as multiplexer, input signals A and B, a selection signal SO, and an inverted selection signal nSO may be transmitted to gates of PMOS transistors PM1, PM2, PM3, and PM4 and gates of NMOS transistors NM1, NM2, NM3, and NM4. That is, to perform an operation of a 2×1 multiplexer, the input signal A should be commonly provided to gates of the PMOS transistor PM1 and the NMOS transistor NM1. Moreover, the input signal B should be commonly provided to gates of the PMOS transistor PM3 and the NMOS transistor NM4. Further, the selection signal SO should be commonly provided to gates of the PMOS transistor PM2 and the NMOS transistor NM3. Further, the inverted selection signal nSO should be commonly provided to gates of the PMOS transistor PM4 and the NMOS transistor NM1. In at least one example embodiment, an output terminal Y may be pulled up or pulled down to a voltage level corresponding to any one of the input signals A and B based on the selection signal SO and the inverted selection signal nSO.

To implement an inverter having a XC according to at least one example embodiment of the inventive concepts, gates of the PMOS transistors PM3 and PM4 and the NMOS transistors NM1 and NM2 in a multiplexer may remain at a floating state. The PMOS transistors 126 and the NMOS transistors 122 may constitute a dummy part that does not substantially take part in an operation of an inverter. Moreover, to implement an inverter part 124 including the XC, the gate of the PMOS transistor PM1 may be grounded and the gate of the NMOS transistor NM4 may be connected to a power voltage VDD. Then, an inverter circuit may be implemented by the transistors PM2 and NM3, which have gates connected to receive the input signal SO. That is, the input signal SO, which is inverted may be transmitted to the output terminal Y.

Figure 3:
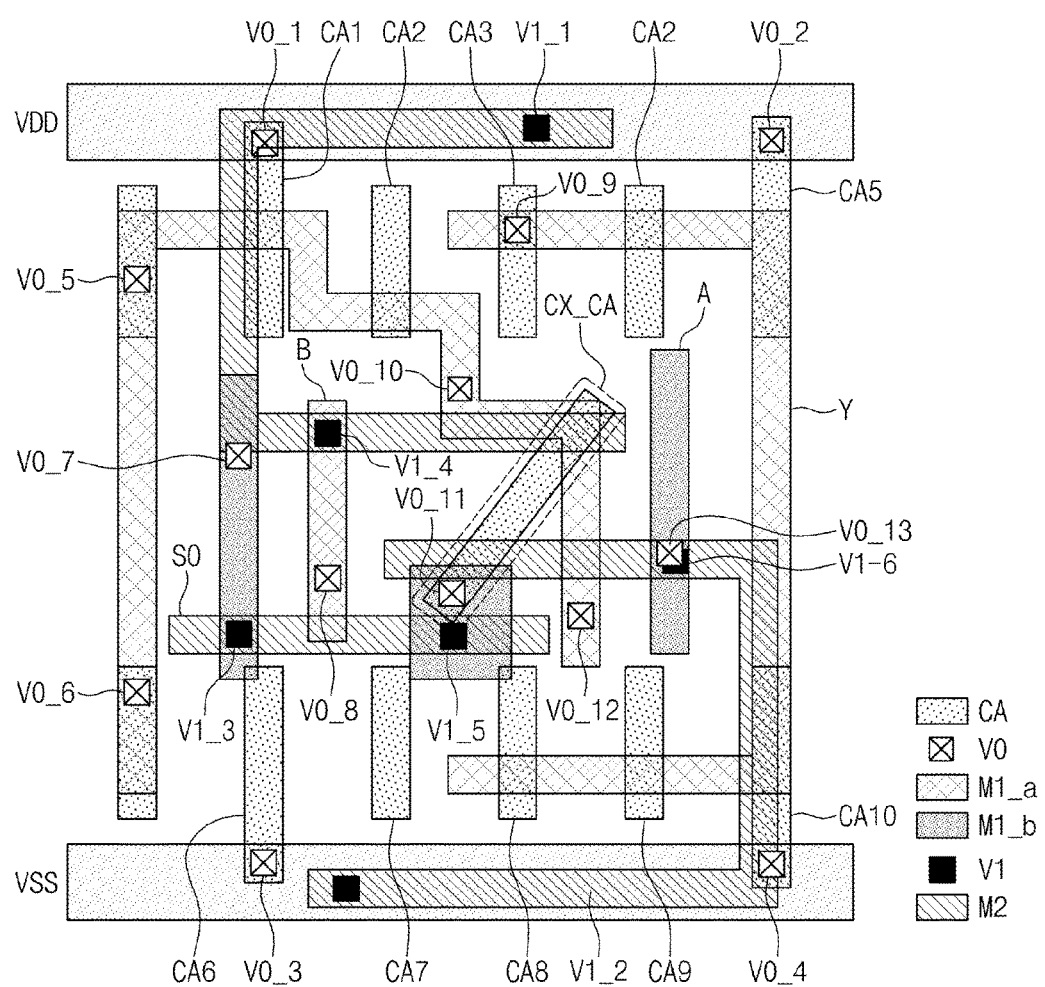
FIG. 3 is a plan view illustrating a routing structure for composing an inverter in FIG. 2.

FIG. 3 is a plan view of a routing structure for implementing an inverter 120 in FIG. 2. Referring to FIG. 3, an inverter 120 may be implemented fundamentally using a 2×1 multiplexer having at least one XC. Here, an activated region, a gate line, a N-well, and a P-well that may be needed and/or desired to form a PMOS transistor may not be illustrated. However, only an interconnection structure including a via and a contact for constituting a transistor or a power rail may be illustrated.

Activated regions for drains or sources of PMOS transistors PM1, PM2, PM3, and PM4 and contacts CA1, CA2, CA3, CA4, and CA5 for connecting conductive lines may be provided. The contact CA1 may be connected to a power rail for supplying a power voltage VDD through a via VO_1. In at least one example embodiment, a source of the PMOS transistor PM1 may be connected to the contact CA1, and the contact CA2 may be connected to a drain of the PMOS transistor PM1, with a gate line interposed therebetween. Moreover, the PMOS transistor PM2 may be formed of the gate line formed between the contacts CA2 and CA3 and activated regions formed on lower layers of the contacts CA2 and CA3.

Moreover, the contact CA5 may be connected to a power rail for supplying a power voltage VDD through the via VO_1. In at least one example embodiment, a source of the PMOS transistor PM3 may be connected to the contact CA5 and the contact CA4 may be connected to a drain of the PMOS transistor PM3, with a gate line interposed therebetween. Moreover, the PMOS transistor PM2 may be formed by activated regions formed on lower layers of the contacts CA3 and CA4 and the gate line formed between the contacts CA3 and CA4.

Activated regions for drains or sources of NMOS transistors NM1, NM2, NM3, and NM4 and contacts CA6, CA7, CA8, CA9, and CA10 for connecting conductive lines may be provided. The contact CA6 may be connected to a power rail for supplying a ground voltage VSS through a via VO_3. In this case, a source of the NMOS transistor NM1 may be connected to the contact CA6 and the contact CA7 may be connected to a drain of the NMOS transistor NM2, with a gate line interposed therebetween. Moreover, the NMOS transistor NM1 may be formed of the gate line formed between the contacts CA7 and CA8 and activated regions formed on lower layers of the contacts CA7 and CA8.

Moreover, the contact CA10 may be connected to a power rail for supplying a ground voltage VSS through the via VO_4. In this case, a source of the NMOS transistor NM4 may be connected to the contact CA10 and the contact CA9 may be connected to a drain of the NMOS transistor NM4, with a gate line interposed therebetween. Moreover, the NMOS transistor NM3 may be formed of the gate line formed between the contacts CA8 and CA9 and activated regions formed on lower layers of the contacts CA8 and CA9.

A multiplexer or an inverter may be implemented by connecting elements using a conductive line such as metal lines or a poly-silicon on the described transistors PM1 to PM4 and NM1 to NM4 and constituting a signal path. Especially, to implement a multiplexer, a XC CX_CA which uses a contact and the XC CX_CA which uses a contact may be formed. First, gate of transistors PM3, PM4, NM1, and NM2 may remain at a floating state to measure an effect of the XC CX_CA for transmitting the selection signal SO to a gate terminal of each of transistors PM2 and NM3.

The selection signal SO of the inverter 120 may be inputted through an upper metal line M2. The upper metal line M2 may be electrically connected to a lower metal line M1_b through an upper via V1_5. The lower metal line M1_b may be connected to a diagonal contact for forming the XC. Although a diagonal contact is not illustrated, it may be commonly connected to gates of the PMOS transistor PM2 and the NMOS transistor NM3. To commonly connect the PMOS transistor PM2 and the NMOS transistor NM3, the diagonal contact having the XC may be needed and/or desired. Moreover, the output terminal Y may be pulled up or pulled down by the selection signal SO transmitted to the diagonal contact formed with the XC. For a pull-up of the output terminal Y, the power voltage VDD may be transmitted to a terminal of the PMOS transistor PM2 through an upper via V1_1.

The diagonal contact may be a component for connecting an activation region and conductive lines of contacts. Accordingly, an electrical characteristic of a rising slope or velocity and a falling slope or velocity of the selection signal SO which passes through the inverter 120 may be determined based on a structure of the diagonal contact. It may be difficult to measure this characteristic using one inverter. Moreover, various kinds of the XC are formed to form one chip. It may be desirable to form a delay chain to measure the electrical characteristics of various XCs such as a delay characteristic.

To form the delay chain, the inverter 120 of at least one example embodiment of the inventive concepts may be implemented using a multiplexer. An inverter including the XCs having a specific shape using the multiplexer may be serially connected. Moreover, when a ring oscillator including a delay chain is composed, a delay or an electrical characteristic on one inverter or one XC may be drawn.

Figure 4:
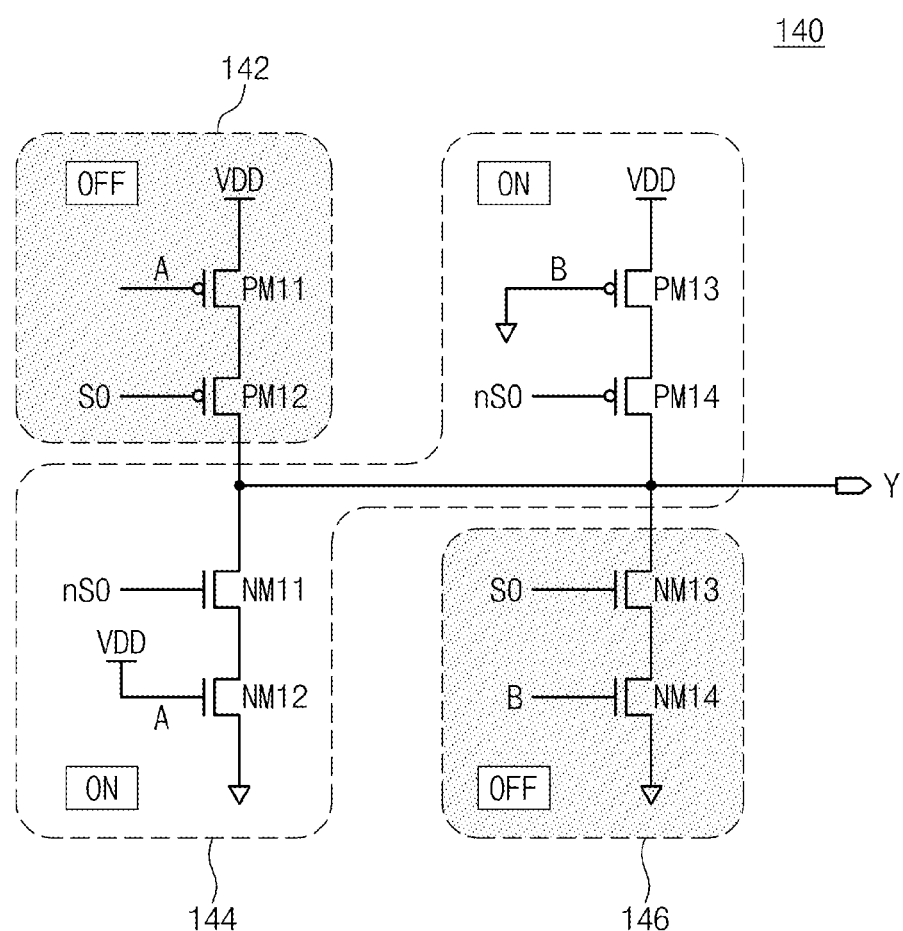
FIG. 4 is a circuit diagram illustrating a structure of an inverter in FIG. 1.

FIG. 4 is a circuit diagram illustrating a structure of the inverter 140 in FIG. 1. Referring to FIG. 4, an inverter 140 may operate as an inverter including a XC through routing of a conductive line in a multiplexer.

In the multiplexer, input signals A and B, a selection signal SO, and an inverted selection signal nSO may be transmitted to gates of PMOS transistors PM11, PM12, PM13, and PM14 and NMOS transistors NM11, NM12, NM13, and NM14. That is, to perform an operation of a 2×1 multiplexer, the input signal A may be commonly provided to gates of the PMOS transistor PM11 and the NMOS transistor NM11. Moreover, the input signal B may be commonly provided to gates of the PMOS transistor PM13 and the NMOS transistor NM14. Further, the selection signal SO may be commonly provided to gates of the PMOS transistor PM12 and the NMOS transistor NM13. Further, the inverted selection signal nSO may be commonly provided to gates of the PMOS transistor PM14 and the NMOS transistor NM11. According to at least one example embodiment, an output terminal Y may be pulled up or pulled down to a voltage level corresponding to any one of the input signals A and B based on the selection signal SO and the inverted selection signal nSO.

To use a multiplexer as an inverter having a XC of a metal line, gates of the PMOS transistors PM11 and PM12 and the NMOS transistors NM13 and NM14 in a multiplexer may remain at a floating state. PMOS transistors 142 and NMOS transistors 146 may constitute a dummy part that does not substantially take part in an operation of an inverter. Moreover, to compose an inverter part 144 including the XC, the gate of the PMOS transistor PM13 may be grounded and the gate of the NMOS transistor NM12 may be connected to a power voltage VDD. In at least one example embodiment, an inverter circuit may be implemented by the transistors PM14 and NM11, which receive the inverted input signal nSO through gates thereof. That is, the inverted input signal nSO which is inverted may be transmitted to the output terminal Y.

Figure 5:
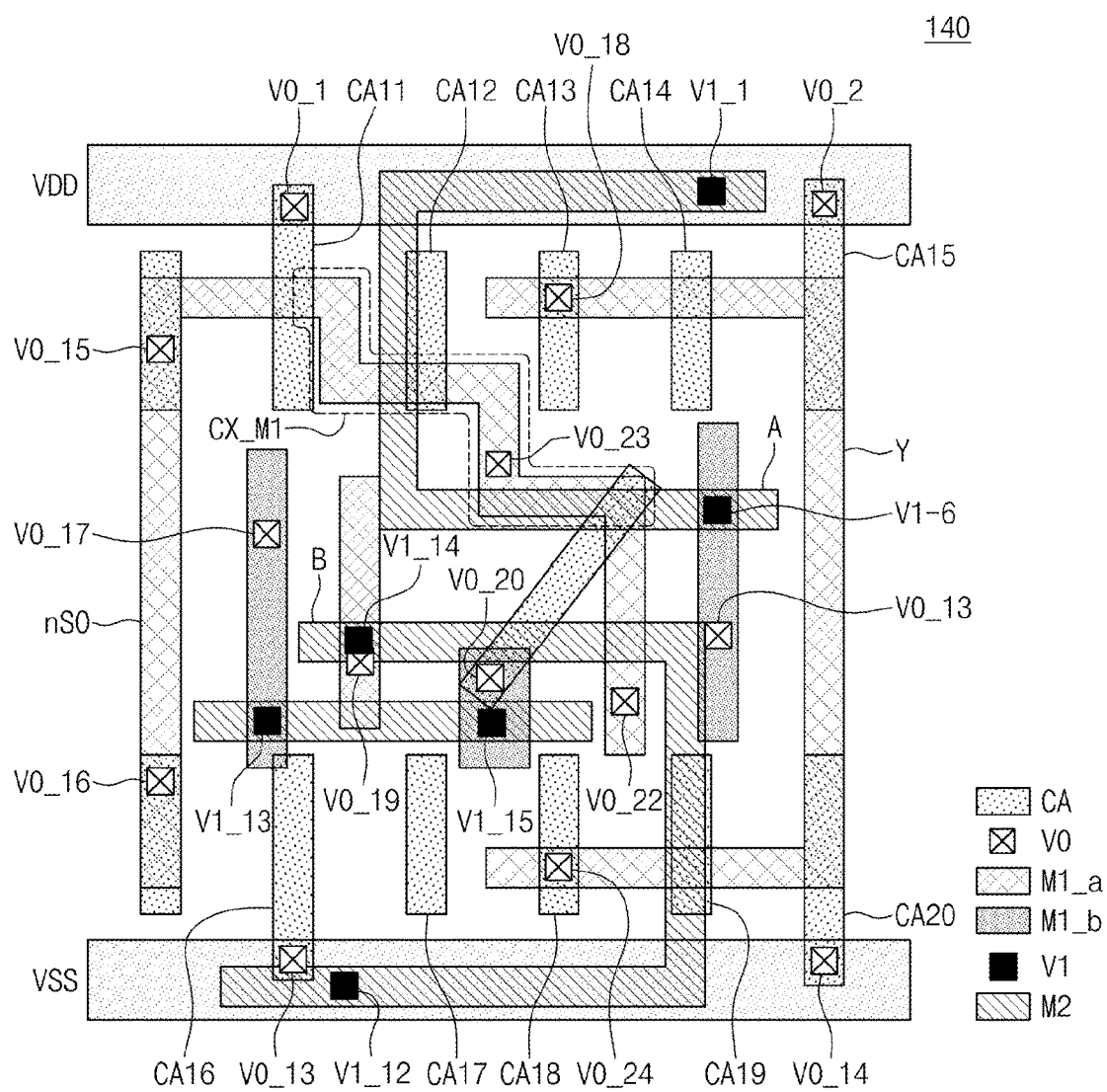
FIG. 5 is a plan view illustrating an interconnection structure for composing an inverter in FIG. 4.

FIG. 5 is a plan view of an interconnection structure for composing the inverter 140 of FIG. 4. Referring to FIG. 5, in at least one example embodiment, the inverter 140 may be implemented fundamentally using a 2×1 multiplexer having at least one XC. Here, an activated region, a gate line, an N-well, and a P-well that may be needed and/or desired to form a PMOS transistor may not be illustrated. However, an interconnection structure for constituting a transistor such as a via and a contact or a power rail may be illustrated in FIG. 5.

In at least one example embodiment, activated regions for drains or sources of PMOS transistors PM11, PM12, PM13, and PM14 and contacts CA11, CA12, CA13, CA14, and CA15 for connecting conductive lines may be provided. The contact CA11 may be connected to a power rail for supplying a power voltage VDD through a via VO_11. In this case, a source of the PMOS transistor PM11 may be connected to the contact CA11 and the contact CA12 may be connected to a drain of the PMOS transistor PM11, with a gate line interposed therebetween. The PMOS transistor PM12 may be formed of the gate line formed between the contacts CA12 and CA13 and activate regions formed on lower layers of the contacts CA12 and CA13.

The contact CA15 may be connected to a power rail for supplying a power voltage VDD through the via VO_11. In at least one example embodiment, a source of the PMOS transistor PM13 may be connected to the contact CA15 and the contact CA14 may be connected to a drain of the PMOS transistor PM13, with gate lines interposed therebetween. Moreover, the PMOS transistor PM14 may be formed of the gate line formed between the contacts CA13 and CA14 and activated regions formed on lower layers of the contacts CA13 and CA14.

Activated regions for drains or sources of NMOS transistors NM11, NM12, NM13, and NM14 and contacts CA16, CA17, CA18, CA19, and CA20 for connecting conductive lines may be provided. The contact CA16 may be connected to a power rail for supplying a ground voltage VSS through a via VO_13. In at least one example embodiment, a source of the NMOS transistor NM11 may be connected to the contact CA16 and the contact CA17 may be connected to a drain of the NMOS transistor NM12, with a gate line interposed therebetween. Moreover, the NMOS transistor NM11 may be formed of the gate line formed between the contacts CA17 and CA18 and activated regions formed on lower layers of the contacts CA17 and CA18.

In at least one example embodiment, the contact CA20 may be connected to a power rail for supplying a ground voltage VSS through the via VO_14. In at least one example embodiment, a source of the NMOS transistor NM14 may be connected to the contact CA20 and the contact CA19 may be connected to a drain of the NMOS transistor NM14 with a gate line interposed therebetween. The NMOS transistor NM13 may be formed of the gate line formed between the contacts CA18 and CA19 and activated regions formed on a lower layer of each of the contacts CA18 and CA19.

A multiplexer or an inverter may be implemented by connecting elements using metal lines or a poly-silicon on the described transistors PM1 to PM4 and NM1 to NM4 and constituting a signal path. As shown, the inverter 140 which uses metal lines (i.e., M1_a layer) as the XC may be formed. Gates of transistors PM11, PM12, NM13, and NM14 may remain at a floating state to measure an effect of the XC CX_M1 for transmitting the inverted selection signal nSO to a gate terminal of each of transistors PM11 and NM14.

The inverted selection signal nSO of the inverter 140 may be inputted through a lower metal line M1. The lower metal line M1 may be electrically connected to a gate line of the PMOS transistor PM14 through an upper via VO_23. The lower metal line M1 may be connected to a gate line of the NMOS transistor NM11 through an upper via VO_22. The inverter 140 includes the XC CX_M1 formed so as to extend diagonally, thereby making it possible for the metal line M1 to be commonly connected to gates of the PMOS transistor PM14 and the NMOS transistor NM11. The output terminal Y may be pulled up or pulled down by the inverted selection signal nSO transmitted to the XC CX_M1 formed using the lower metal line M1.

To form the delay chain, the inverter 140 of at least one example embodiment of the inventive concepts may be implemented using a multiplexer. Inverters including the XCs having a specific shape using the multiplexer may be serially connected. A delay or an electrical characteristic on one inverter or one XC may be drawn when a ring oscillator including a delay chain is implemented.

In at least one example embodiment, a method in which an inverter is implemented based on a kind of XC and a ring oscillator using the implemented inverter as a delay chain is provided. An inverter which is implemented by adjusting routing of a multiplexer in which various the XCs are included is described. The ring oscillator may be implemented by serially connecting XCs of the same kind using a set of cells, blocks, or elements as well as a multiplexer. Moreover, the XC which uses a metal or a contact may be exemplarily described but the XC is not limited to such kinds. For example, a delay chain or a ring oscillator may be formed to measure delay characteristics or electrical characteristics of structures such as a vertical contact, an asymmetric gate line, and contact jumpers as well as the XC.

Figure 6:
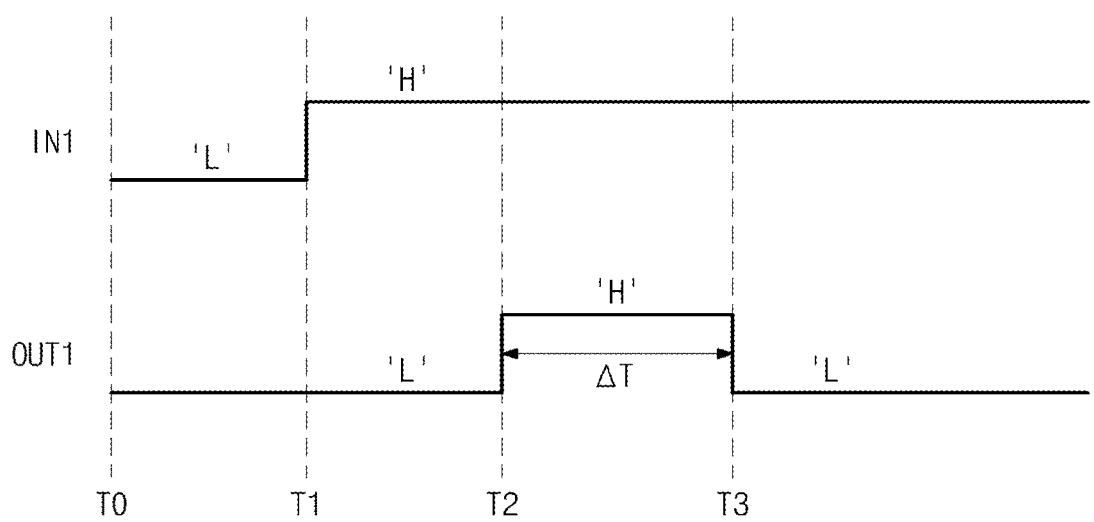
FIG. 6 is a waveform diagram illustrating input and output waveforms of a ring oscillator shown in FIG. 1, according to at least one example embodiment of the inventive concepts.

FIG. 6 is waveform diagram illustrating input and output waveforms of the ring oscillator 120 shown in FIG. 1, according to at least one example embodiment of the inventive concepts. Referring to FIG. 6, a ring oscillator 120 may generate an output signal OUT1 having a pulse shape with respect to an input signal IN1.

In at least one example embodiment, it is assumed that the input signal IN1 transitions from a low level 'L' to a high level 'H' in time T1. Here, the input signal IN1 may be provided through an additional pad formed in a semiconductor device 100 to perform a test or be generated by a specific logic circuit. The input signal IN1 may remain at high level 'H' after time T1.

In at least one example embodiment, the input signal IN1 may be transmitted to a first input terminal of an AND gate 115 via a delay chain which is formed of inverters. Moreover, the input signal IN1 does not pass through an additional element and may be transmitted to a second input terminal of the AND gate. The input signal which is supplied to the second input terminal may ideally transition to a high level 'H' from time T1. However, the input signal Ni which passes through the delay chain may transition to a high level 'H' at a point in time delayed as much as a delay time when each of inverters takes part in.

In short, the input signal IN1 which passes through the delay chain may transition to a high level 'H' in time T2 and then to a low level 'L' again in time T3. Here, a length of a pulse width ΔT which is observed in the output signal OUT1 may correspond to an effect by a delay chain. Accordingly, a magnitude of an average delay on each of inverters may be calculated by the time of the pulse width ΔT by the number of inverters which constitute the delay chain. Moreover, a magnitude of a delay by the XC of each of these inverters may be calculated using the magnitude of the average delay thus generated.

Figure 7:
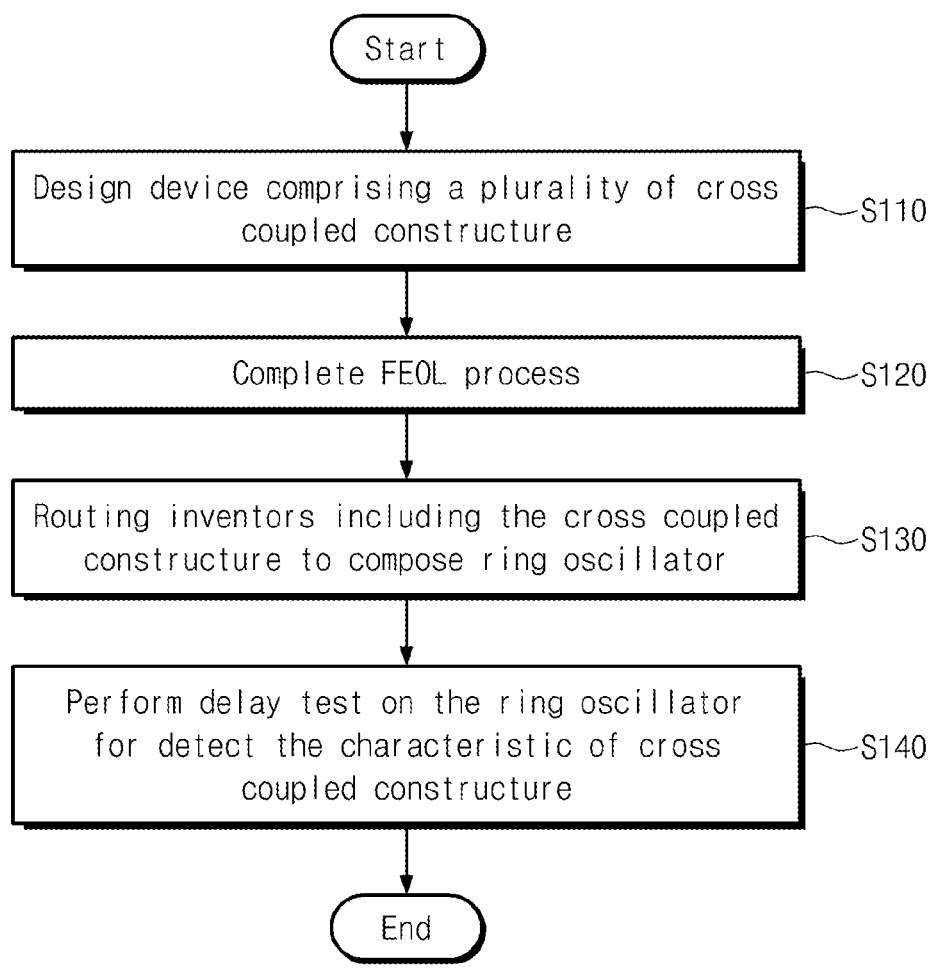
FIG. 7 is a flow chart briefly illustrating a method of verifying a layout structure including a XC according to at least one example embodiment of the inventive concepts.

FIG. 7 is a flow chart briefly illustrating a method of verifying a layout structure including a XC according to at least one example embodiment of the inventive concepts. Referring to FIG. 7, a semiconductor device 100 under testing may be formed through a back end of line (BEOL) after a front end of line (FEOL) in which implementation of a basic element is completed.

In operation S110, a schematic and layout design on a semiconductor device may be performed. That is, a design on the semiconductor device using various kinds of XCs may be performed. A design on the semiconductor 100 may be classified into a schematic design operation and a layout design operation. In a schematic design operation, a design and verification on various schematic circuits may be performed using various design tools. When the verification on the schematic design is completed, a layout design may be performed. Various layout structures corresponding to a schematic circuit may be generated. Here, the XC may be applied for efficiency of a chip area.

In operation S120, the semiconductor device 100 for verification of a layout may be manufactured. A mask on various patterns may be applied to implement a designed layout on a semiconductor substrate and the FEOL on the semiconductor device 100 may be performed. An element and a portion of contacts in the semiconductor device 100 may be formed through the FEOL. An operation for forming a contact may be referred to as a middle of line (MOL). In the FEOL, an arrangement of elements may be determined and a portion of contacts or contact plug may be formed. Moreover, the XC which uses a lower contact may be formed in the FEOL.

In operation S130, the BEOL may be performed and an inverter for measuring a characteristic of the XC of at least one example embodiment of the inventive concepts and a ring oscillator for connecting the inverter may be formed. The XC formed with a metal line may be formed in the BEOL operation. In the BEOL, each of a plurality of multiplexer cells may be routed and inverters which use the XC formed on a specific position may be formed. Moreover, ring oscillators 110, 130, and 150 shown in FIG. 1 of at least one example embodiment of the inventive concepts may be provided by using the plurality of inverter cells and the AND gate.

In operation 5140, test equipment performs a test procedure on the semiconductor device 100. That is, the test equipment may provide input signals IN1, IN2, and IN3 to the ring oscillators 110, 130, and 150 through pads, respectively. Moreover, when output signals OUT1, OUT2, and OUT3 of the ring oscillators 110, 130, and 150 are detected, delay characteristics on different XCs may be calculated.

As described above, the semiconductor device 100 for verifying a layout according to at least one example embodiment of the inventive concepts may constitute a delay chain including a specific type of the XC after the FEOL. Moreover, the delay characteristic of the XC may be detected using the delay chain. A ring oscillator may be formed, for example, to detect the delay characteristic of the delay chain. According to at least one example embodiment of the inventive concepts, an effect in a mounted environment by the XC through a ring oscillator including a specific kind of the XC may be easily identified in a layout verification operation.

Figure 8:
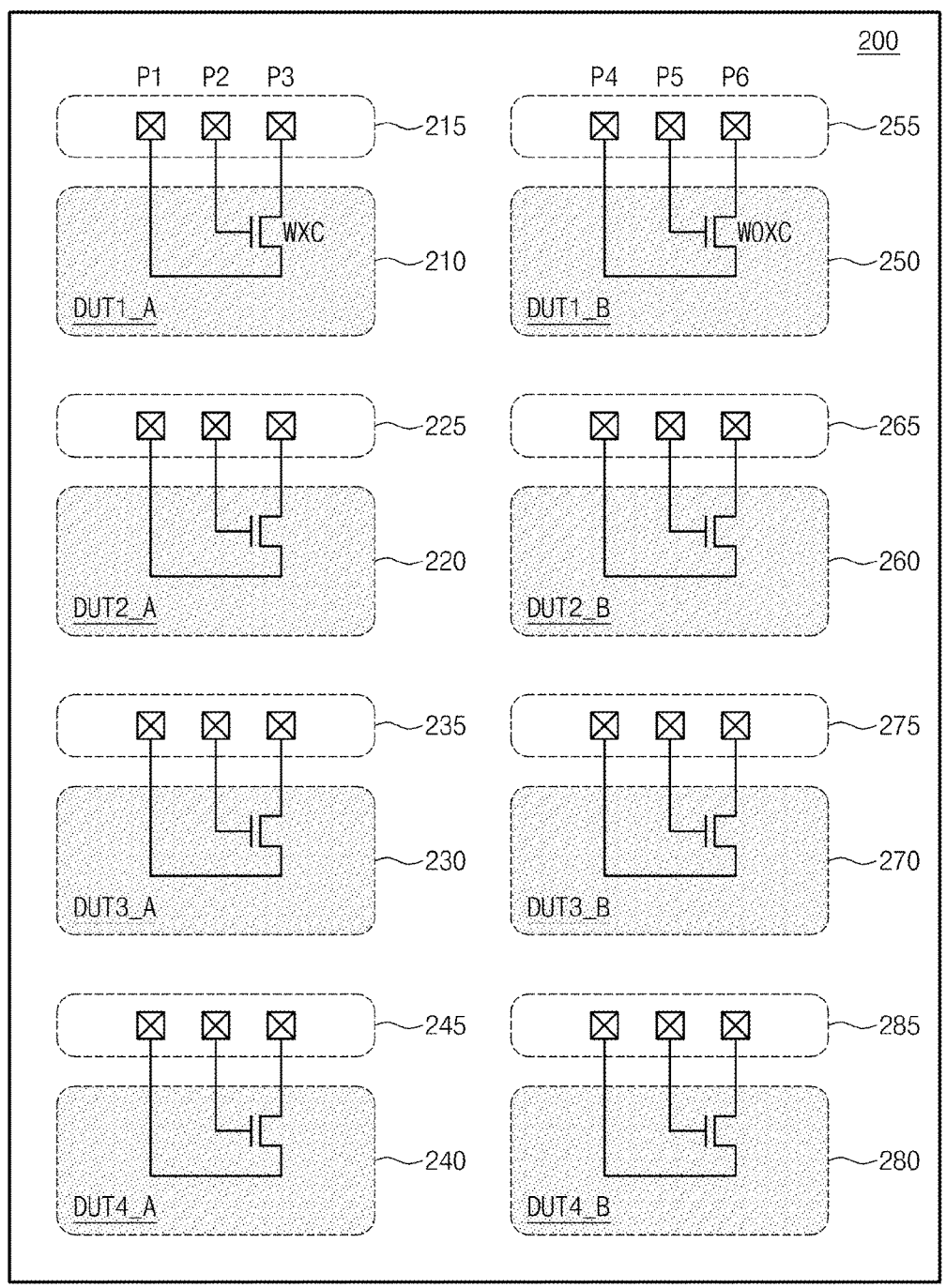
FIG. 8 is a block diagram illustrating a semiconductor device according to at least one example embodiment of the inventive concepts.

FIG. 8 is a block diagram illustrating a semiconductor device 200 according to an example embodiment of the inventive concepts. Referring to FIG. 8, a semiconductor device 200 may include a first DUT group DUTn_A and a second DUT group DUTn_B to detect a characteristic of the XC. The first DUT group DUTn_A may include transistors 210, 220, 230, and 240 each including a XC. The second DUT group DUTn_B may include transistors 250, 260, 270, and 280 each not including a XC.

Moreover, pads 215, 225, 235, and 245 for detecting input and output characteristics of the transistors 210, 220, 230, and 240 in the first DUT group DUTn_A may also be formed. As shown, the pads 215, 225, 235, and 245 for probing a source, a gate, and a drain of each of the transistors 210, 220, 230, and 240 may be formed in each of transistors. However, the pads 215, 225, 235, and 245 may be formed to share any one of pad sets P1, P2, and P3.

Each of the transistors 250, 260, 270, and 280 in the second DUT group DUTn_B may not include the XC. Pads 255, 265, 275, and 285 for detecting an input and output characteristic of each of the transistors 250, 260, 270, and 280 may be formed. As shown, in at least one example embodiment, the pads 255, 265, 275, and 285 for probing a source, a gate, and a drain of each of the transistors 250, 260, 270, and 280 may be formed in each of transistors. The pads 255, 265, 275, and 285 may be formed to share any one of pad sets P4, P5, and P6.

In at least one example embodiment of the semiconductor device 200, the transistors 250, 260, 270, and 280 in the second DUT group DUTn_B may be provided as reference elements. Moreover, an electrical characteristic of the XC may be detected through each of the transistors 210, 220, 230, and 240 in the first DUT group DUTn_A including the XC of the same shape. For example, a magnitude of drain-source resistance of each of the transistors 210, 220, 230, and 240 in the first DUT group DUTn_A may be compared with that of drain-source resistance of each of the transistors 250, 260, 270, and 280 in the second DUT group DUTn_B. A magnitude of a resistor of the XC may be estimated using the compared results. Moreover, the XC included in each of the transistors 210, 220, 230, and 240 in the first DUT group DUTn_A may be provided with different shapes. An electrical characteristic on the XC of the different shapes may be estimated through a comparison with the transistors 250, 260, 270, and 280 in the second DUT group DUTn_B which is a standard.

Figure 9:
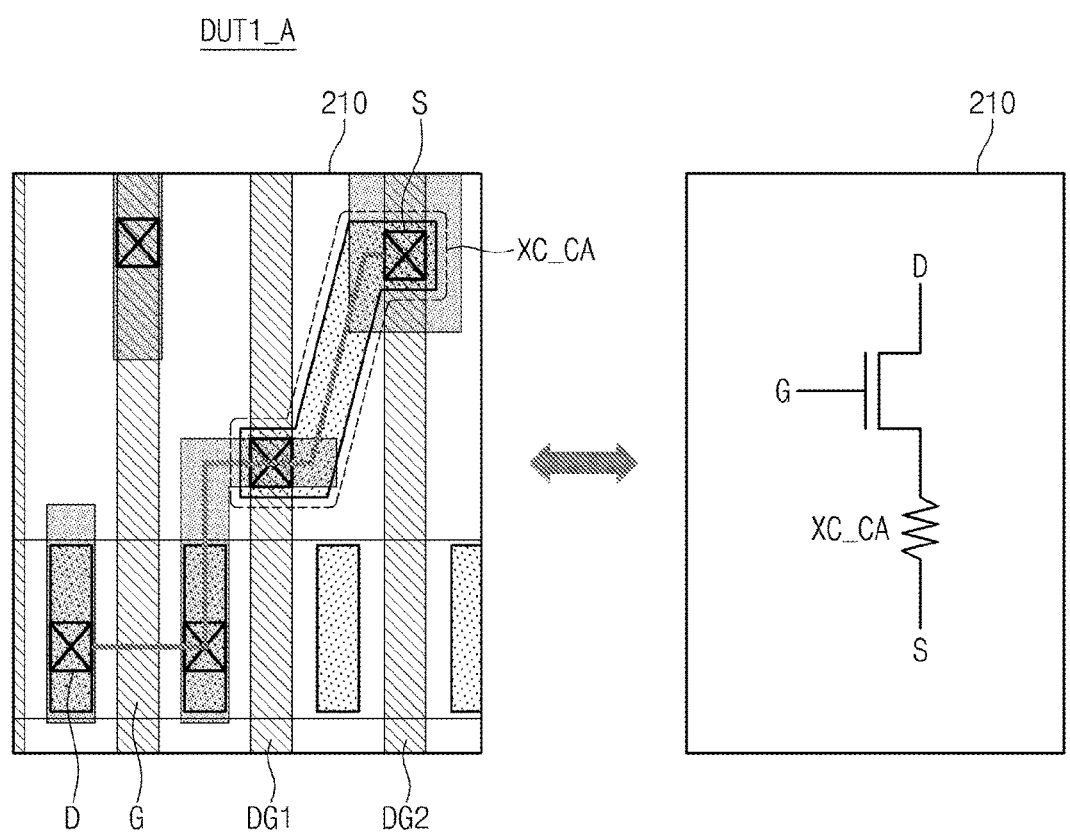
FIG. 9 is a diagram briefly illustrating a layout and an equivalent circuit of a transistor including a XC in FIG. 8.

FIG. 9 is a diagram briefly illustrating a layout and an equivalent circuit of a transistor including a XC of FIG. 8. Referring to FIG. 9, a transistor 210 in the first DUT group DUTn_A may include a XC XC_CA formed with a contact of a diagonal direction to form a source terminal. The source terminal substantially connected through a probing may further include a resistor element or a capacitor element by the XC XC_CA. This XC XC_CA in the equivalent circuit may be modeled as source resistance Rxc added by the XC XC_CA. Also, in the case of detecting a characteristic on an excessive response, although not shown, capacitance added by the XC XC_CA may be included.

Figure 10:
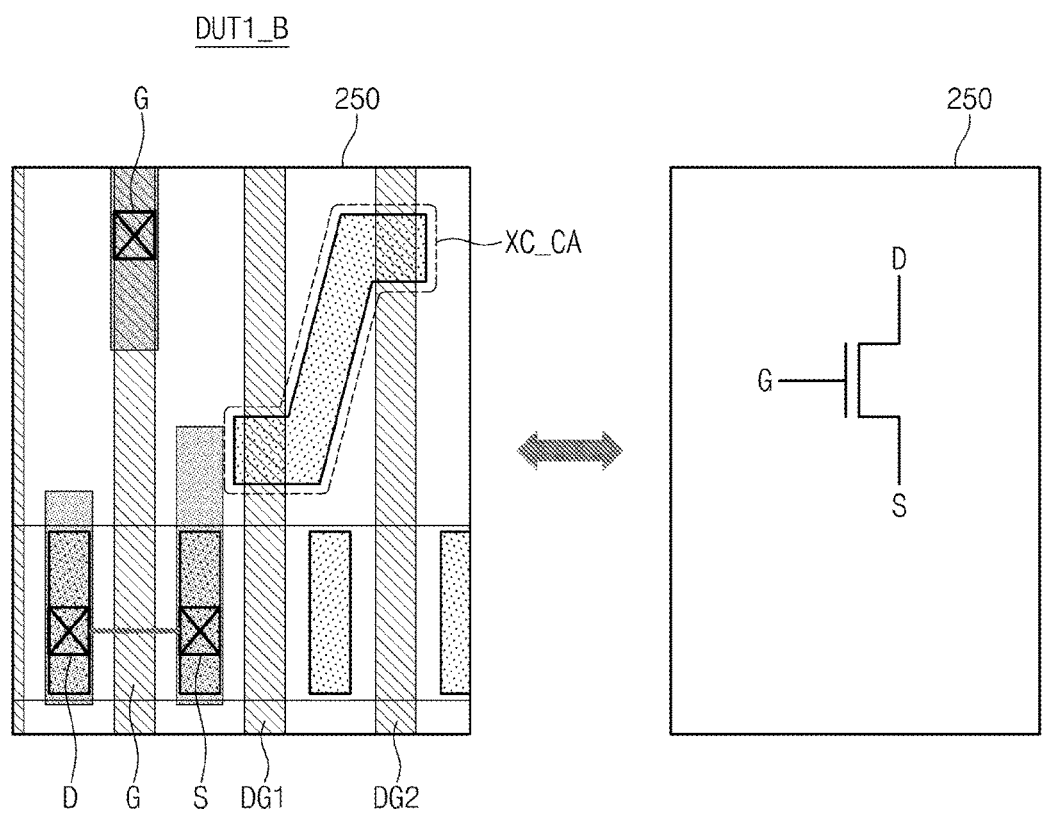
FIG. 10 is a diagram briefly illustrating a layout and an equivalent circuit of a standard transistor not including a XC in FIG. 8.

FIG. 10 is a diagram briefly illustrating a layout and an equivalent circuit of a standard transistor not including a XC in FIG. 8. Referring to FIG. 10, a source terminal, connected for probing, of a transistor 250 in the second DUT group DUTn_B may be formed without passing through the XC. Accordingly, in an equivalent circuit, source resistance Rxc added by the XC XC_CA may be modeled as not existing.

Figure 11:
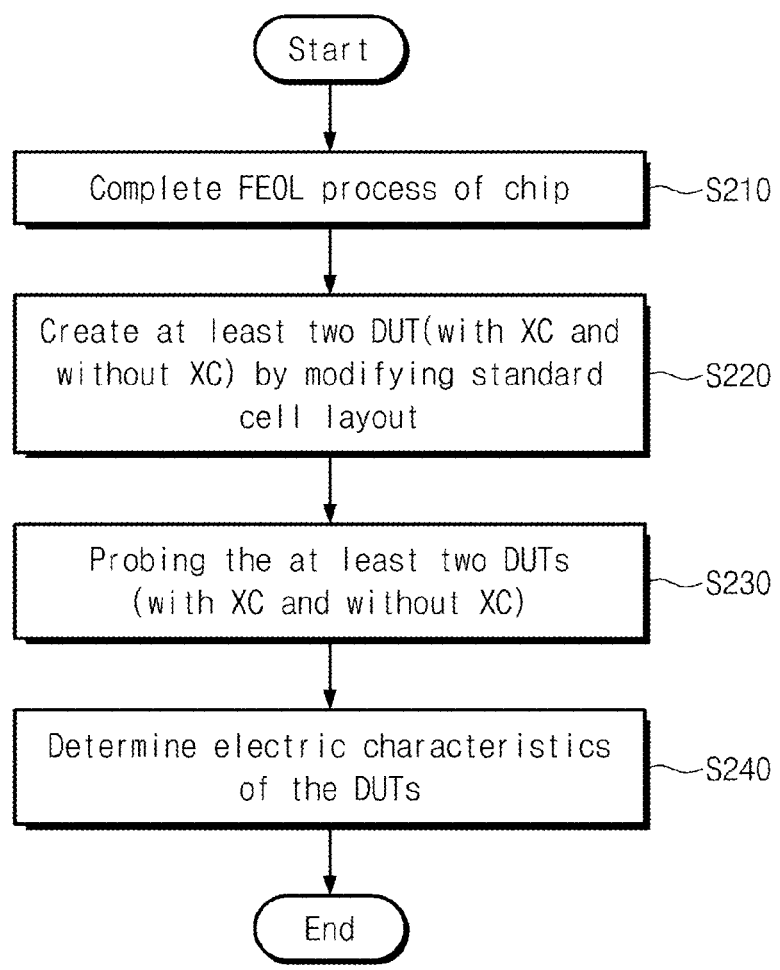
FIG. 11 is a flow chart briefly illustrating a method of verifying characteristics of elements including a XC in FIG. 8.

FIG. 11 is a flow chart illustrating a method of verifying a characteristic of elements including a XC of FIG. 8. Referring to FIG. 11, routing for dividing into a reference group and a test group after a FEOL in which implementation of an element is completed may be perform with respect to a semiconductor device 200.

In operation 5210, the semiconductor device 200 may be manufactured to verify a layout. The FEOL for implementing the layout which is designed on a semiconductor substrate may be performed. An element of the semiconductor device 200 and a portion of contacts may be formed through the FEOL. An arrangement of elements may be determined in the FEOL and a portion of the contacts or contact plugs may be formed. Moreover, a XC which uses a lower contact may be formed in the FEOL.

In operation 5220, a first DUT group DUTn_A and a second DUT group DUTn_B may be formed by performing a BEOL and using a layout of a standard cell. For example, the BEOL may be performed such that each of transistors in the first DUT group DUTn_A includes the XC. On the other hand, interconnection may be formed with each of reference transistors not including the XC in the second DUT group DUTn_B.

In operation 5230, each of the transistors in the first DUT group DUTn_A and the second DUT group DUTn_B may be measured.

In operation 5240, an effect on the XC included in each of the transistors in the first DUT group DUTn_A may be evaluated by comparing the measurement results on the first DUT group DUTn_A and the second DUT group DUTn_B.

As described, a semiconductor device including the first DUT group DUTn_A and the second DUT group DUTn_B and a layout verification method using the same may be described to verify a characteristic of the XC. The semiconductor device capable of providing an optimal operation characteristic may be implemented by detecting an electrical characteristic of the XC having various formations in a layout design operation.

Figure 12:
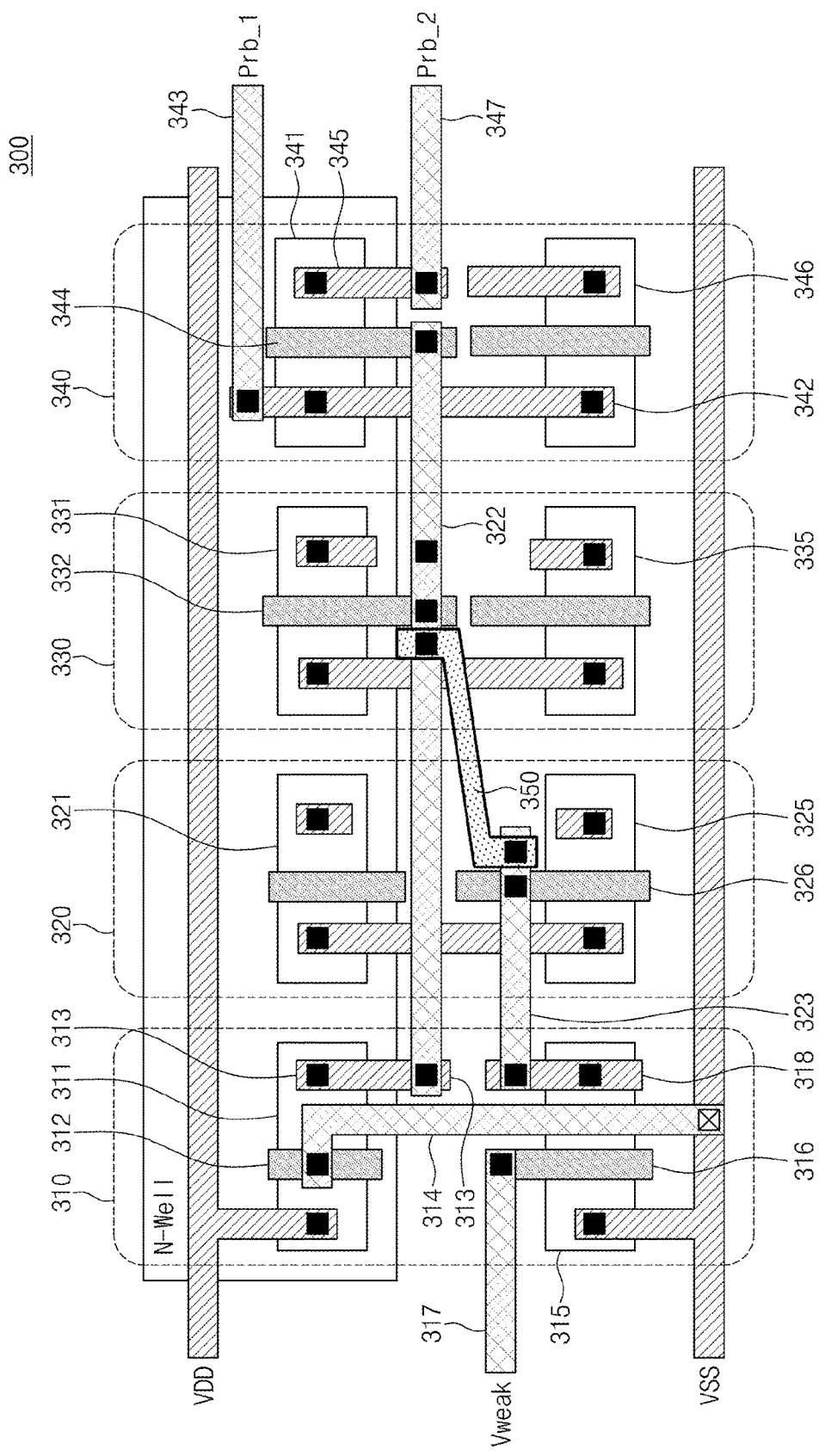
FIG. 12 is a diagram illustrating a semiconductor device according to at least one example embodiment of the inventive concepts.

FIG. 12 is a diagram illustrating a semiconductor device 300 according to at least one example embodiment of the inventive concepts. Referring to FIG. 12, a semiconductor device 300 may be configured to measure a DC current of the XC.

The semiconductor device 300 may be implemented by adjusting interconnection of each of inverters which constitute one cell row. The XC may be added by adjusting interconnection of each of inverters formed in a FEOL. Moreover, when the XC is formed in the FEOL, the semiconductor device 300 may set the XC to have a function of a voltage divider through adjustment of interconnection.

A plurality of inverter cells 310, 320, 330, and 340 may be formed through the FEOL. A PMOS transistor of each of a plurality of inverter cells 310, 320, 330, and 340 may be formed in an N-well.

The plurality of inverter cells 310, 320, 330, and 340 may be composed of a measurement circuit having the XC as the voltage divider through a BEOL. For example, the voltage divider circuit may be formed by serially connecting the XCs 350 having a metal element diagonally formed between a PMOS transistor and an NMOS transistor in an inverter cell 310. Moreover, interconnection may be formed such that a drain of the PMOS transistor in the inverter cell 310 is connected to a gate 344 the PMOS transistor formed in the inverter cell 340.

First, a source of the PMOS transistor in the inverter cell 310 may be connected to a power voltage VDD of a power rail. The gate of the PMOS transistor in the inverter cell 310 may be connected to a ground voltage VSS. Accordingly, the PMOS transistor in the inverter cell 310 may remain in a turn-on state. The drain of the PMOS transistor in the inverter cell 310 may be connected to the XC 350, which is formed of a metal line, and a gate line 344 through a metal line 322 and a contact 313. The gate line 344 may be included in the PMOS transistor in the inverter cell 340. Moreover, the XC 350 may be connected to the drain of the NMOS transistor in the inverter cell 340 through a via, a metal line 323, or a contact 318. The source of the NMOS transistor in the inverter cell 310 may be connected to the ground voltage VSS. Moreover, a control voltage Vweak may be provided to the gate of the NMOS transistor in the inverter cell 310. In this structure, probing ports Prb_1 and Prb_2 may be formed at both terminals of the PMOS transistor in the inverter cell 340.

By the described interconnection structure, the XC is electrically connected between the drain of PMOS transistor in the inverter cell 310 and the drain of NMOS transistor therein. Moreover, the power voltage VDD which is divided by the XC may be transmitted to the gate of the PMOS transistor in the inverter cell 340. A magnitude of a channel current of the PMOS transistor in the inverter cell 340 may be determined based on a magnitude of a voltage between both terminals of the XC. When the magnitude of the channel current of the PMOS transistor in the inverter cell 340 is measured through the probing ports Prb_1 and Prb_2, an electrical characteristic of the XC may be measured.

Figure 13:
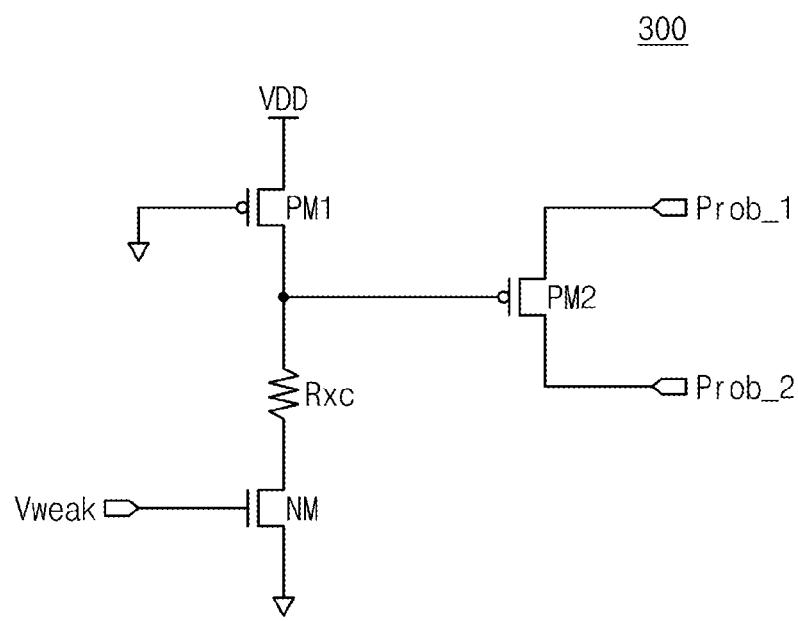
FIG. 13 is an equivalent circuit corresponding to a layout in FIG. 12.

FIG. 13 is an equivalent circuit corresponding to the layout of FIG. 12. Referring to FIG. 13, a channel current of a PMOS transistor PM2 may be determined by the XC 350 which operates as a division resistor.

In a semiconductor device 300 formed through a BEOL, a current corresponding to a magnitude of a division voltage across both terminals of the XC operating as the voltage division resistor Rxc may be detected. This current may be detected through a voltage applied to both terminals of the PMOS transistor PM2.

Figure 14:
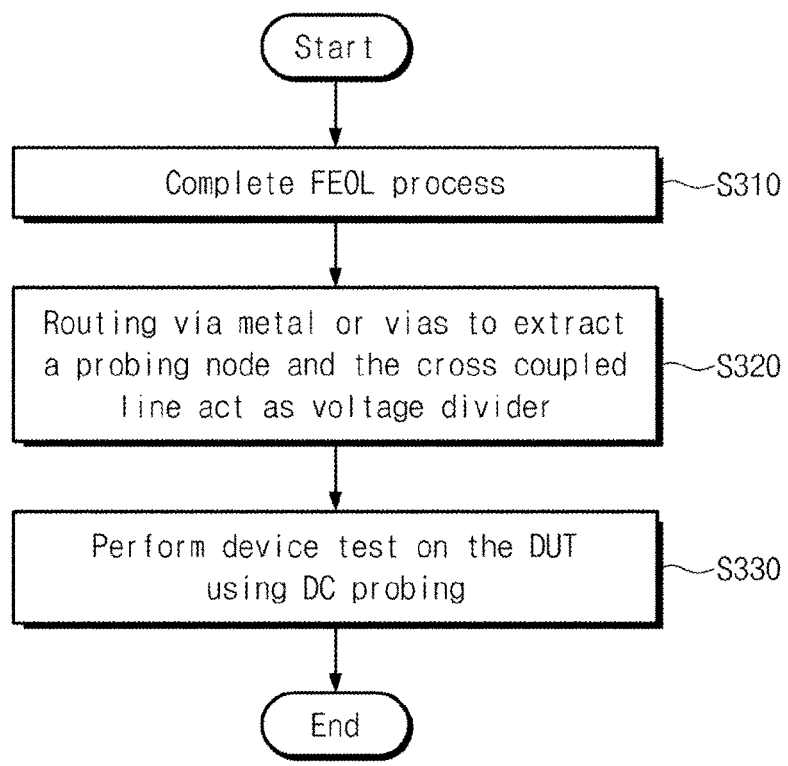
FIG. 14 is a flow chart illustrating a layout verification method according to at least one example embodiment of the inventive concepts.

FIG. 14 is a flow chart illustrating a layout verification method according to at least one example embodiment of the inventive concepts. Referring to FIG. 14, when an element of a semiconductor device 300 is implemented, a BEOL for connecting the XC as a voltage division resistor may be performed. Moreover, a DC measurement may be performed by probing the semiconductor device 300 and a resistor value of the voltage division resistor or various electrical characteristics may be calculated.

In operation 5310, the semiconductor device 300 for verifying a layout may be manufactured. The FEOL for implementing a designed layout on a semiconductor substrate may be performed. Elements of the semiconductor device 300 and a portion of contacts may be formed through the FEOL. An arrangement of the elements in the FEOL may be determined and a portion of the contacts or contact plugs may be formed. Moreover, the XC may be formed in the FEOL.

In operation 5320, an input port, to which a control voltage Vweak is applied, and probing ports Prb_1 and Prb_2 may be formed by performing the BEOL. Moreover, the XC may be connected between a PMOS transistor PM1 and a NMOS transistor NM. A drain of the PMOS transistor PM1 may be connected to a gate of the PMOS transistor PM2. The control voltage Vweak may be provided to the gate of the PMOS transistor PM2. The probing ports Prb_1 and Prb_2 may be connected to both ports of the PMOS transistor PM2.

In operation 5330, a probing test on the semiconductor device 300 may be performed. Here, a magnitude of a current which flows into both ports of the PMOS transistor PM2 may be measured through the probing ports Prb_1 and Prb_2 under the predetermined control voltage Vweak. Here, a resistor value of the XC 350 which operates as a voltage division resistor may be calculated based on the magnitude of the current which is measured.

As described, an example embodiment of the inventive concept may be described using inverter cells. However, example embodiments of the inventive concepts are not limited hereto and may implement the semiconductor device 300 for layout verification in which the XC operates as the voltage division resistor by combining various cells or elements.

A semiconductor device according to at least one example embodiment of the inventive concepts may be installed using a package of various formations. For example, a semiconductor device may be installed using packages such as a package on package (PoP), a ball grid arrays (BGAs), a chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi chip package (MCP), a wafer-level fabricated package (WFP), and a wafer-level processed stack package (WSP).

While the inventive concepts have been described with reference to example embodiments, it will be apparent to those skilled in the art that various changes and modifications may be made without departing from the spirit and scope of the inventive concepts. Therefore, it should be understood that the above example embodiments are not limiting, but illustrative.

What is claimed is:
1. A layout verification method of a semiconductor device having a cross coupled structure (XC), the layout verification method comprising:
    manufacturing a first semiconductor device having the XC, the manufacturing including
        forming a plurality of standard cells on a substrate of the semiconductor device, each standard cell of the plurality of standard cells having a first type of XC and a second type of XC, and forming a plurality of first inverters in which the first type of the XC is activated among the plurality of the standard cells and a plurality of second inverters in which the second type of the XC is activated among the plurality of the standard cells; and estimating an electrical characteristic of at least one type of XC of the first type of the XC and the second type of the XC of the manufactured first semiconductor device based on measuring a magnitude of a signal delay of at least one plurality of inverters of the plurality of the first inverters and the plurality of the second inverters.

2. The layout verification method of claim 1, wherein each of the plurality of the standard cells includes a multiplexer for selecting one of a plurality of inputs respectively.

3. The layout verification method of claim 2, wherein the first type of the XC and the second type of the XC are formed with conductive lines of different layers.

4. The layout verification method of claim 3, wherein the first type of the XC is formed with a metal line and the second type of the XC are formed with a contact.

5. The layout verification method of claim 1, wherein the plurality of the first inverters and the plurality of the second inverters are combined to form at least one of a delay chain, a pulse generator, and a ring oscillator.

6. The layout verification method of claim 4, wherein the estimating an electrical characteristic includes:

calculating a delay characteristic of the first type of the XC by dividing a magnitude of a signal delayed through the plurality of the first inverters by a quantity of the plurality of the first inverters; and calculating a delay characteristic of the second type of the XC by dividing a magnitude of a signal delayed through the plurality of the second inverters by a quantity of the plurality of the second inverters.

7. The layout verification method of claim 1, further comprising:

manufacturing a second semiconductor device configured to provide an optimal operation characteristic based on the electrical characteristic.

8. A semiconductor device comprising:

a first circuit configured to electrically connect elements or conductive lines using a first connection structure, the first connection structure being a first type of cross coupled structure (XC), the first circuit including a plurality of first inverters;

a second circuit configured to electrically connect elements or conductive lines using a second connection structure, the second connection structure being a second type of XC, ), the second circuit including a plurality of second inverters; and a plurality of pads configured to verify an electrical characteristic of the first type of XC or the second type of XC by measuring an input and output characteristic of the first circuit or the second circuit, the measuring including measuring a magnitude of a signal delay of at least one plurality of inverters of the plurality of the first inverters and the plurality of the second inverters.

9. The semiconductor device of claim 8, wherein, the first circuit includes a first ring oscillator including the plurality of first inverters which are serially connected, and the second circuit includes a second ring oscillator including the plurality of second inverters which are serially connected.

10. The semiconductor device of claim 9, wherein the plurality of first inverters and the plurality of second inverters are formed by adjusting an interconnection of a multiplexer cell.

11. The semiconductor device of claim 10, wherein each of the first circuit and the second circuit is an inverter formed by adjusting an interconnection supplying a power voltage or a ground voltage to an input terminal of the multiplexer cell.

12. The semiconductor device of claim 8, wherein the first circuit includes a transistor to which a cross coupled structure is applied and the second circuit is provided as a transistor to which the cross coupled structure is not applied.

13. The semiconductor device of claim 12, wherein an electrical resistance or capacitance corresponding to the cross coupled structure is calculated by comparing input and output characteristics of the first circuit and the second circuit.

14. The semiconductor device of claim 12, wherein the first connection structure or the second connection structure include at least one of the cross coupled structure, a vertical contact, an asymmetric gate line, and contact jumpers.

15. A method of verifying a layout structure including a cross coupled structure, comprising:

performing at least one of a schematic design operation and a layout design operation associated with a semiconductor device;

forming the semiconductor device, the semiconductor device including a ring oscillator, the ring oscillator including a first type of cross coupled structures (XC) and a second type of XC, the ring oscillator further including a plurality of first inverters in which the first type of the XC is activated among a plurality of standard cells and a plurality of second inverters in which the second type of the XC is activated among the plurality of standard cells;

testing the semiconductor device, the testing including estimating an electrical characteristic of at least one type of XC of the first type of XC and the second type of XC of the semiconductor device based on measuring a magnitude of a signal delay of at least one plurality of inverters of the plurality of the first inverters and the plurality of the second inverters; and manufacturing a second semiconductor device configured to provide an optimal operation characteristic based on the electrical characteristic.

16. The method of claim 15, wherein the testing the semiconductor device includes inputting signals to the ring oscillator through pads.

17. The method of claim 16, wherein the testing the semiconductor device includes detecting output signals of the ring oscillator.

18. The method of claim 17, wherein the testing the semiconductor device includes calculating delay differences of the first type of XC and the second type of XC based on the output signals.

19. The method of claim 15, wherein the semiconductor device includes a delay chain and the method further includes detecting delay characteristics of the first type of XC and the second type of XC using the delay chain.

* * * * *